United States Patent [19]
Abramovici et al.

[11] Patent Number: 5,590,135
[45] Date of Patent: Dec. 31, 1996

[54] TESTING A SEQUENTIAL CIRCUIT

[75] Inventors: Miron Abramovici, Naperville, Ill.; Vishwani D. Agrawal, New Providence; Kwang-Ting Cheng, Edison, both of N.J.; Krishna B. Rajan, Chicago, Ill.

[73] Assignee: Lucent Technologies Inc., Murray Hill, N.J.

[21] Appl. No.: 795,404

[22] Filed: Nov. 20, 1991

[51] Int. Cl.$^6$ .................................................. H04B 17/00
[52] U.S. Cl. ............................... 371/22.1; 371/22.1
[58] Field of Search .................... 371/22.1, 15.1, 371/23, 27; 364/488, 579, 580

[56] References Cited

U.S. PATENT DOCUMENTS

| | | | |
|---|---|---|---|
| 4,519,078 | 5/1985 | Komonytsky | 371/25 |
| 4,601,032 | 7/1986 | Robinson | 371/23 |
| 4,602,210 | 7/1986 | Fasong et al. | 324/73 R |
| 4,669,061 | 5/1987 | Bhavsar | 365/154 |
| 4,894,830 | 1/1990 | Kawai | 371/22.3 |
| 4,914,379 | 4/1990 | Maeno | 371/22.3 |
| 5,103,167 | 4/1992 | Okano et al. | 324/158 R |
| 5,230,001 | 7/1993 | Chandra et al. | 371/27 |

OTHER PUBLICATIONS

"SCIRTSS: A Search System for Sequential Circuit Test Sequences" by Hill et al. IEEE pp. 490–502, May 1977.
"A Random and an Algorithmic Technique for Fault Detection Test Generation for Sequential Circuits" by Breuer, IEEE, Nov. 1971, pp. 149–158.
"Automatic Test Generation and Test Verification of Digital Systems" by Verma et al Burroughs Corp. IEEE, Sep. 1974 pp. 1364–1370.

*Primary Examiner*—Robert W. Beausoliel, Jr.
*Assistant Examiner*—Phung My Chung
*Attorney, Agent, or Firm*—Henry T. Brendzel

[57] ABSTRACT

A method for testing a sequential circuit by applying a number of test vectors to the primary inputs of the sequential circuit between each application of a clock circuit. Once the sequential circuit enters a state and that state is a necessary condition for detecting various faults, test vectors are applied to the primary inputs of the sequential circuit, which vectors are designed to propagate all fault effects that can be propagated at that state of the circuit. Once those vectors have been applied, a state-advancing vector is applied immediately before the application of the clock. The state-advancing vector is designed to condition the circuit to allow more fault effects to be propagated to the primary outputs, and to propagate fault effects into the storage elements of the circuit.

1 Claim, 3 Drawing Sheets

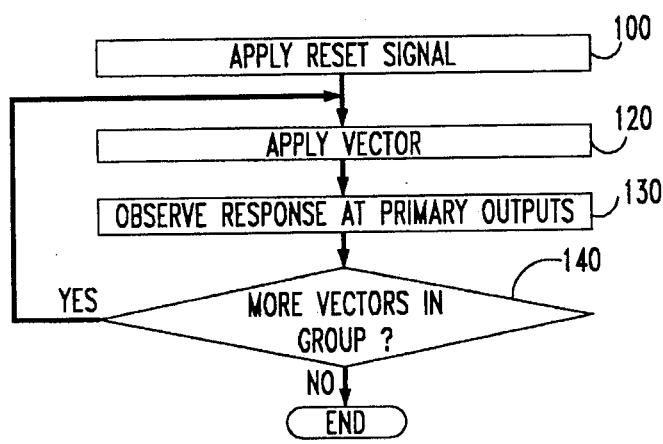
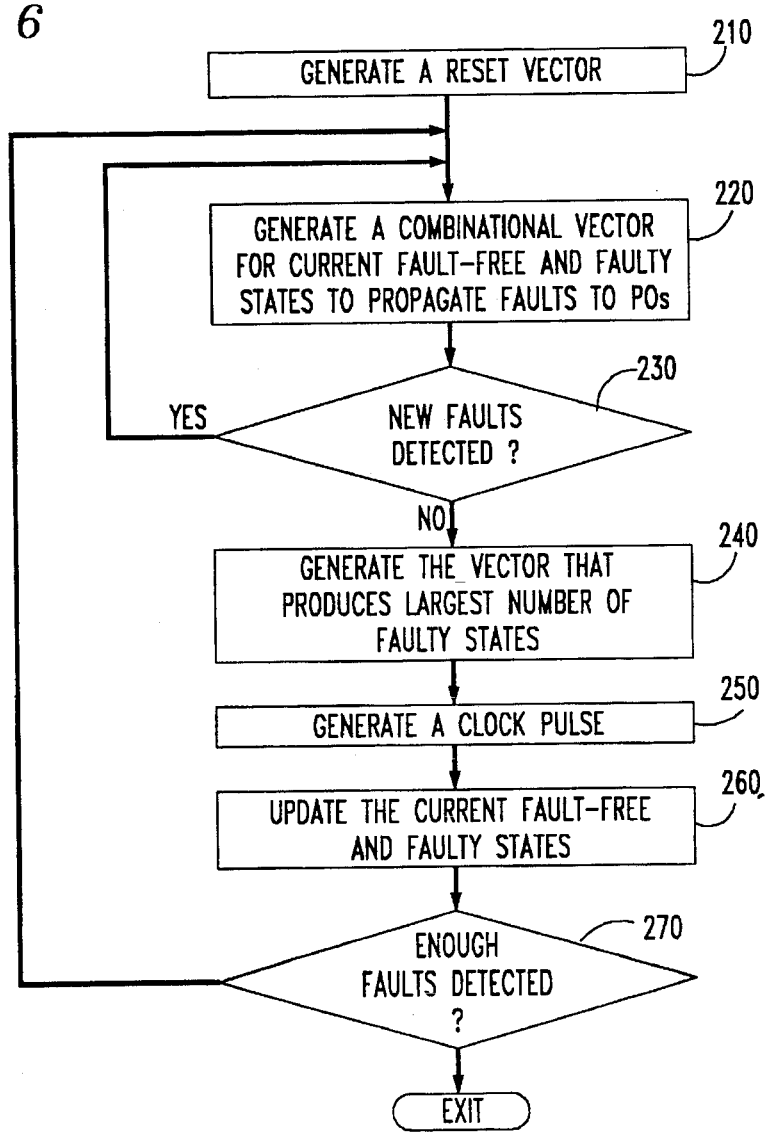

TESTING A SEQUENTIAL CIRCUIT

BACKGROUND OF THE INVENTION

This invention relates to sequential circuits and more particularly to the process of testing sequential circuits.

A synchronous sequential circuit can always be represented in the canonical form shown in FIG. 1. It comprises a combinational portion 10 that is fed by primary inputs x and by state variables y. Variables y are provided by the outputs of the clocked flip-flops that form the memory portion 20 of the FIG. 1 circuit. Combinational portion 10 provides feedback outputs Y that are applied to portion 20 and primary outputs Z that form the outputs of the FIG. 1 circuit. The various states that the flip-flops in portion 20 can assume form the set of states of the FIG. 1 circuit. Stated in other words, every state of the FIG. 1 circuit corresponds to a different combination of values of the state variables, y. The FIG. 1 circuit changes state only when it receives a pulse on the clock line of portion 20 which allows the flip-flops to change state. Although a sequential circuit may have several different clocks, the following discusses the case of only one clock signal, but as will be clearly apparent hereinafter, this invention is applicable to circuits with any number of clocks.

In the classical method for testing sequential circuits, a sequence of test vectors is applied to the circuit while the circuits outputs are observed. Each vector is a set of bits which correspond in number to the number of primary inputs, x. The specific procedure is to apply a test vector to the inputs, supply a clock signal to the circuit, observe the outputs Z, supply the next vector, and repeat the process. With each application of the clock signal, the circuit is made to enter the state dictated by the inputs, Y, to portion 20.

By carefully selecting the sequence of test vectors, a large proportion of the possible fault effects in the sequential circuit (perhaps even all) can be made to appear at the primary outputs of the circuit under test and, thus, be observed and detected.

For test generation, i.e., for the process that generates the sequence of test vectors, the synchronous sequential circuit of FIG. 1 can be modeled by a pseudo-combinational iterative array of FIG. 2. Basically, this modeling technique maps the time domain response of the sequential circuit into a space domain response of the iterative array, and allows test generation methods developed for combinational circuits to be extended to synchronous sequential circuits. In FIG. 2, x(0) is the first applied vector, y(0) is the state of the circuit at the time x(0) is applied, Y(0) is the output of portion 10 that is applied to flip flops 20, y(1) is the output of the flip-flops that are responsive to input Y(0), etc. The FIG. 2 model is equivalent to the FIG. 1 model because each cell C(i) of the array is identical to the combinational circuit portion 10 of FIG. 1. In this transformation, the clocked flip-flops are modeled as combinational elements, and thus they may be more correctly referred to as pseudo-flip-flops. The pseudo-flip-flops have direct connections from input to output.

The test generation problem for sequential circuits is very complex because the search for a solution involves multiple time frames, as demonstrated by the FIG. 2 model. In the presence of cycles, i.e., flip-flops forming circular loop structures, the worst-case complexity of a sequential test generation algorithm is an exponential function of the number of flip-flops in the circuit. Many approaches have been reported in the literature that employ different variations of the classical techniques. By way of example, U.S. application Ser. No. 07/497,824 filed Mar. 22, 1990, entitled "A Cost-directed Search Method for Generating Test for Sequential Logic Circuits" describes one such variation.

While these approaches all attempt to speed up the testing process, a basic problem remains which is associated with the fact that each application of a test vector is accompanied with the application of a clock. Usually, the current state is a necessary condition for detecting a set of fault effects F. However, because the prior art applies only one vector in the current state, only a subset of F can be detected. Sometimes, that subset is extremely small, and that results is a very long test sequence.

This phenomenon may best be illustrated, perhaps, with a circuit that is driven by a counter. FIG. 3, for example, contains a three stage simple binary counter that, on consecutive applications of the clock, advances through states 000, 001,010, 011, 100, 101, 110, 111 in sequence. The combinational circuitry in FIG. 3 develops an output S=0 only when the counter is in state 111. To fully test OR gate 30, one needs to apply the combinations (A=0, S=0), (A=1, S=0), and (A=0, S=1). Thus, both combinations that require S=0 also require the counter to be in state 111. But in the classical approach, when the counter is in state 111 and one vector is applied, say A=1, followed by activation of the clock, the counter goes into state 000. Then, to be able to apply the combination (A=0, S=0) to the OR gate, the counter must be brought again into the desired state 111, which means that the entire cycle of 8 states must be traversed.

This type of operation is obviously less than optimal, since a circuit may have to be cycled through many states for the sole purpose of reaching a previously reached state, only to allow the application of another vector. Such recycling may need to be carried out a number of times, and that is clearly inefficient. This deficiency is inherent in the classical mode of testing sequential circuits and is independent of the method used for generating test sequences.

SUMMARY OF THE INVENTION

In the method of this invention, once the sequential circuit enters a state, a number of test vectors are applied to the primary inputs of the sequential circuit without applying a clock signal to the circuit. Thus, if the current state is a necessary condition for detecting a set of fault effects, the circuit remains in this state while all the required vectors are applied at the primary inputs. The vectors that are applied can be selected by carrying out a conventional process for selecting test vectors to propagate fault effects in a combinatorial circuit. Advantageously, the process employed is one that is adapted to allow constraining a subset of the inputs to specified values; where the constrained input correspond to the values of the current state variables, y.

In accordance with one feature of this invention, the selected set of vectors for testing the combinatorial circuit for a given input from the memory elements is augmented with a final test vector that propagates fault effects to the inputs of the memory elements. With the application of this final test vector, a clock signal is applied to the memory elements, thereby storing those fault effects and advancing the circuit to its next state. The process of selecting a new subset of test vectors for the newly-entered state is repeated, keeping in mind that those vectors can propagate not only fault effects within the combinatorial circuits but also fault effects appearing at the y inputs of the combinatorial circuit.

BRIEF DESCRIPTION OF THE DRAWING

FIG. 5 presents a simplified flow diagram of a testing procedure in accordance with the principles of this invention; and FIG. 6 illustrates a flow diagram for creating the set of vectors employed in the process of FIG. 4.

DETAILED DESCRIPTION

Figure 1:
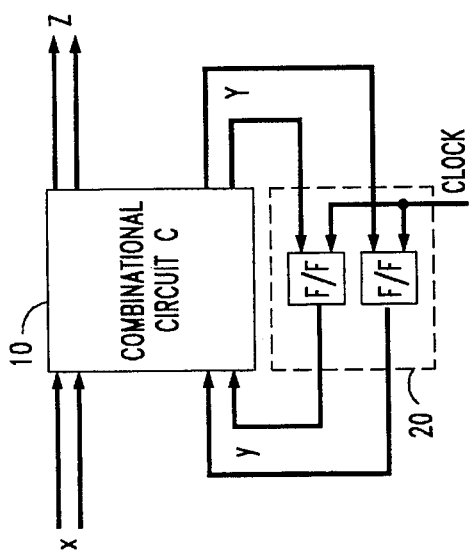
FIG. 1 illustrates the classical modeling approach of sequential circuits that demonstrates the divisibility of sequential circuits into a combinatorial portion and a memory portion.
Figure 2:
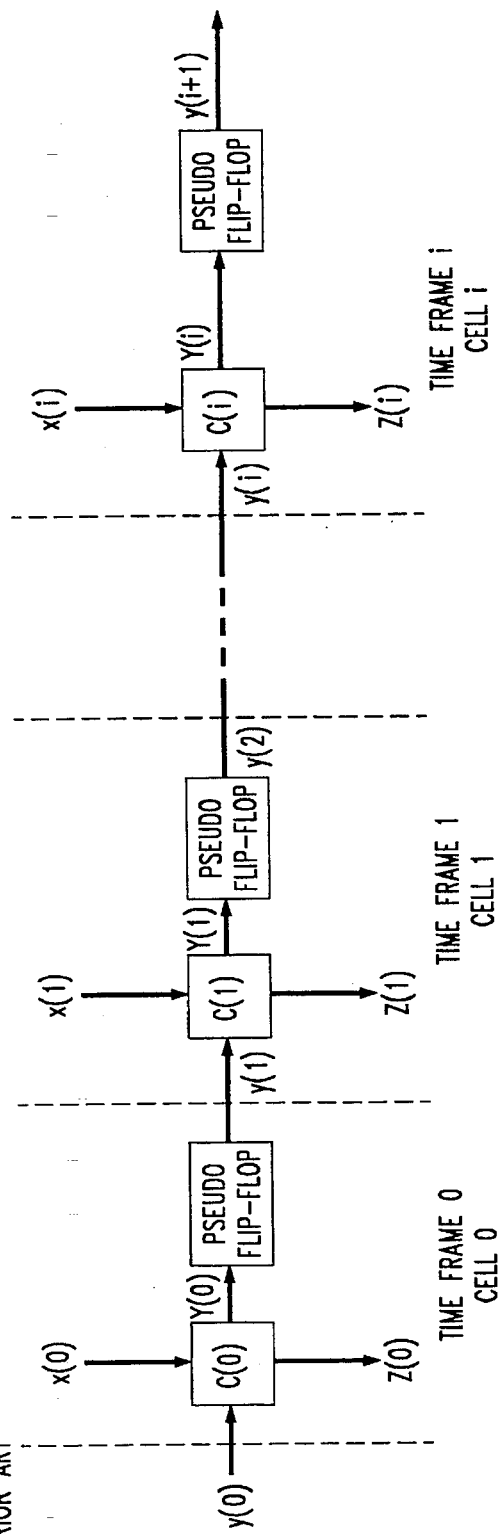
FIG. 2 presents a different model structure for the sequential circuits.
Figure 3:
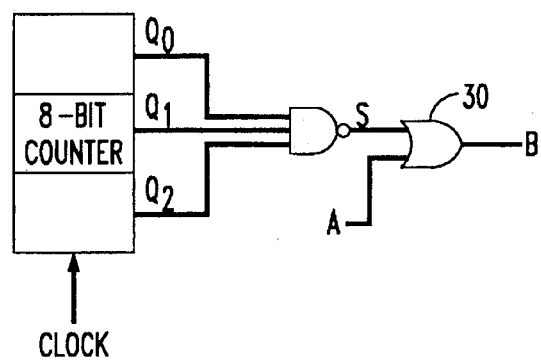
FIG. 3 presents a simple circuit that illustrates a problem that classical testing methodologies may encounter.
Figure 4:
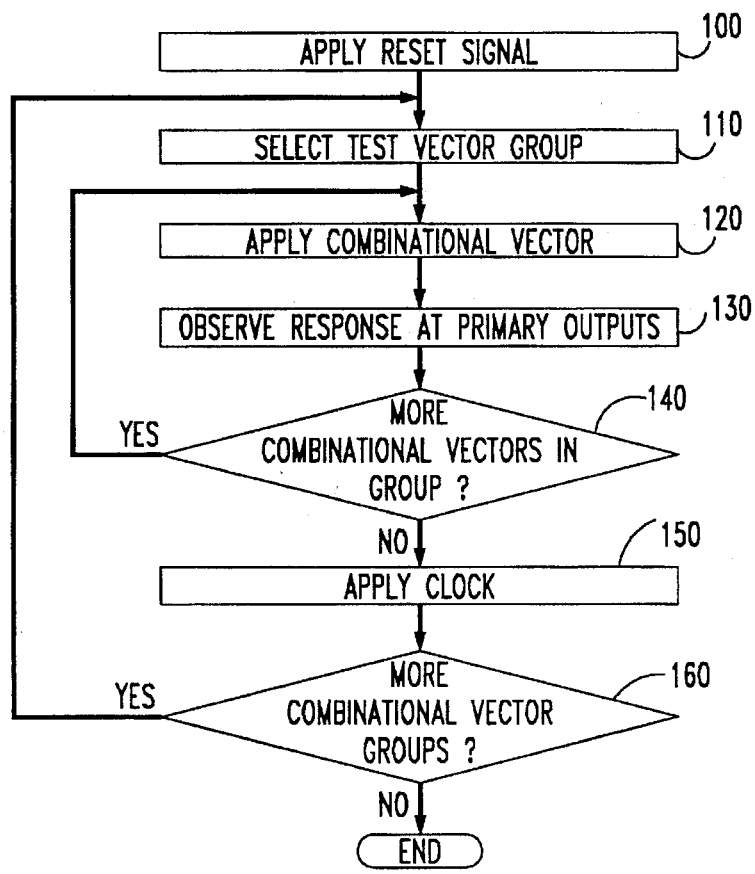
FIG. 4 present s a flow diagram of a testing procedure in accordance with the principles of this invention.

A testing process that conforms to the principles of this invention is illustrated in FIG. 4. First, block 100 brings the circuit to a known state. When the circuit under test (such as the circuit of FIG. 3) has a "reset" input, block 100 sends a special signal to the "reset" input so that all flip-flops in the circuit are brought into a known initial state. Otherwise, block 100 may apply a sequence of signals to inputs x of the circuit, with the signals selected to settle the circuit at a known state. Alternatively, as will become apparent hereinafter, the process can skip block 100 entirely.

In the following blocks, the circuit is tested with a plurality of signal vector groups. For each vector group, the vector signals are applied to inputs x, one vector at time, separated by a time interval that is sufficient to assess the circuits response. The clock signal is not applied to the circuit between the vector signals of a group and, consequently, the circuit responds like a combinational circuit that is equal to the "frozen" image of the sequential circuit at the particular state of the sequential circuit. Viewed another way, these vectors test the combinational circuit subject to the current inputs y. When all the vector signals in the group have been applied, a clock signal is applied to the circuit, and the circuit is advanced to the next state. Thereafter, another group of test vectors is applied, and the process is repeated until all test vector group s have been applied. It may be noted that the order of application of the vector signals in the group is unimportant, save for the last vector signal. That vector signal controls the next state of the sequential circuit, so it must be chosen with care.

More specifically, block 110 selects a group of vectors and passes control to block 120. Block 120 selects one of the vector signals in the group ("combinational vector") and applies it to the circuit. In block 130, the circuits response at the primary outputs (Z) is observed (and, optionally, recorded) and control passes to decision block 140. When block 140 determines that the group of test vectors for the current state has not been exhausted, control returns to block 120 and the actions of blocks 120 and 130 are repeated with the next vector in the group. Otherwise, control passes to block 150 which advances the circuit to the next state. Thereafter, block 160 determines whether a vector group exists for that new state of the circuit that needs to be applied to the circuit. When such a group exists, control passes to block 110. Otherwise, the process terminates.

It was state in connection with block 100 stated that when a reset input is not available in the circuit under test, block 100 may be skipped entirely. The reason for that comes from our realization that when the circuit under test is in an unknown state, there may still be fault effects that can be propagated to the output and thus be tested for. After all such fault effects are handled, the last vector advances the circuit to the next state, perhaps to propagate a fault effect to an output Y, and thereby advancing the circuit toward a known state, or at least a more known (i.e., at least partially defined) state. Thus, the normal action of blocks 110–160 both initializes the circuit as needed and test s the circuit.

While FIG. 4 describes a process that conforms to the principles of this invention, it should be understood that some modifications can be made to the flow chart without departing from the spirit and scope of the invention. For example, block 150 can follow block 160 rather than precede it. Also, the actual realization of the FIG. 4 process might degenerate to the chart of FIG. 5 when the clock is considered to be just another test vector. That is, in the actual realization, the circuit under test is likely to be plugged into a multi-lead bus that is connected to a computer. Through that but the computer sends signal to input leads, x, and to the clock lead, and receives information from outputs Z. The computer includes a table of test vectors and those test vectors are sent to the circuit in sequence, at a selected clock rate. That is, the signals of the test vector (i.e., the plurality of signals that are destined to inputs x and the clock signal) are sent in parallel, and successive vector signals are sent seriatim. With every so many test vectors that have signals on the x leads but no signal on the clock lead a test vector is sent that has no signals on the x leads but has a signal on the clock lead. This advances the circuit to the next state, and the process of applying test vector signals and reading the circuits outputs continues. The process terminates when the table of test vector signals is exhausted.

Inasmuch as the testing method of this invention differs from the classical testing methods, it follows that the test generation method must also be different. The process for creating a test sequence in accordance with the principles of this invention is described in FIG. 6. Block 210 needs to place the circuit into a known state. When the circuit under test has a "reset" input, block 210 merely generates the appropriate signal to activate the reset port of the circuit under test. Otherwise, block 210 may generate an initializing test sequence which will insure that the circuit under test will have a known state. The technique that may need to be employed to generate this initializing test sequence depends on the circuit design but, typically, such a test sequence is very simple. For example, programmers know what sequence initializes a designed circuit, so that sequence may be employed. Also, as disclosed above, there is no real need to initialize the circuit. The initialization can be folded into the entire testing process.

Whatever the current state, the circuit will remain at that state throughout the steps described in blocks 220 and 230. During this phase, the circuit behaves like a combinational one because the values in the flip-flops are "frozen". These values in fault-free, or faulty, circuit correspond to the values of the outputs of the flip-flops defining the current fault-free, or faulty, state of the sequential circuit.

Bock 220 maintains a table of faults that need to be detected, and with the aid of that table, block 220 generates a candidate test vector signal. Often, the aim is to identify a test vector signal that propagates as many undetected fault effects as possible to the primary outputs. One approach for developing such a test vector is described, for example, in U.S. Pat. No. 4,204,633 issued May 27, 1980.

If such a test vector that propagates fault effects to the primary outputs is found, i.e., block 220 is successful, control is returned by block 230 to block 220. Otherwise, control passes to block 240.

The goal of the combinational vectors generated in block 220 is to propagate fault effects toward the primary outputs. That includes fault effects in the combinational portion of the circuit (portion 10), and it also includes faults stored in the flip-flops of portion 20, which manifest themselves via "faulty" input signals y. Of course, the faults stored in the flip-flops are faults that have been propagated to outputs Y in the previous time frame. These fault effects are present as long as the circuit remains in the same state, allowing each one of the combinational vectors to propagate some of the fault effects to the primary outputs. This type of operation is not possible with the classical methods of testing. Block 220 can generate one or more vectors.

Having exhausted both the circuit faults and y-input faults that can be propagated to the primary outputs, block 230 passes control to block 240. In block 240, exactly one combinational vector is selected that propagates undetected faults to outputs Y. That is, whereas block 220 selects vectors that propagate fault effects to primary outputs, Z, block 240 selects a vector that propagates untested fault effects to feedback outputs Y. The selection process in block 240 may be based on the concept of propagating as many fault effects to outputs Y as is possible, or it may be based on the concept of propagating particular fault effects to the Y outputs - those that can be propagated to the primary outputs as quickly as possible. See the aforementioned U.S. application Ser. No. 07/497,824. Following the selection performed in block 240 a vector group is finished, and it is now time to advance the circuit under test to a next state, as dictated by the test vector selected in block 240. The indication that a clock signal is to be applied is provided by block 250. Thereafter, control passes to block 260 which updates the table of faults that have been detected at the Y outputs and passes control to block 270. Block 260 can employ any method like the one described by Cheng and Yu in "Differential Fault Simulation for Sequential Circuits", "Journal of Electronic Testing: Theory and Application", Vol. 1, 1990, pp. 7–13. Block 270 determines whether a sufficient number of faults have been tested for, and when the answer is in the affirmative, then the process terminates. Otherwise, control returns to block 220.

It is a common practice to use the functional vectors that are generated by designers for verifying the functionality of the design, as test vectors for testing the created circuit. This saves at least some of the test generation effort. Since these vectors are not designed to detect manufacturing defects, a certain percentage of faults will not be detectable by these vectors. Using the proposed testing process, we can improve and augment the functional vectors to detect more fault effects. In particular, each state that is entered into when following the functional vectors suggested by the circuit designers is burdened with additional vectors that advance all of the fault effects that can be advanced at that state.

We claim:

1. A method for testing a sequential circuit having signal inputs and a clock input, the clock input being the input where application of a pulse causes a change in values of memory elements in the circuit, when input conditions call for a change in said values, said method comprising the steps of:

obtaining from a memory a test vector comprising bits dedicated to said signal inputs, those being data bits, and a bit dedicated to said clock input, that being the clock bit;

applying the test vector to said circuit by applying the data bits to the signal inputs and applying the clock bit to the clock input;

observing output signal of said circuit, and returning to said step of obtaining;

wherein the test vectors stored in said memory either have the clock bit active or some of the data bits active, but not both, and there are at least two vectors consecutively obtained from the memory where the data bits are active.

* * * * *